US011346890B2

(12) United States Patent
Oda et al.

(10) Patent No.: US 11,346,890 B2
(45) Date of Patent: May 31, 2022

(54) SECONDARY BATTERY CONTROL DEVICE

(71) Applicant: Hitachi Automotive Systems, Ltd., Hitachinaka (JP)

(72) Inventors: Masanari Oda, Tokyo (JP); Shuichi Suzuki, Tokyo (JP); Shigeki Makino, Tokyo (JP); Takenori Ishizu, Hitachinaka (JP); Ryohhei Nakao, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 519 days.

(21) Appl. No.: 16/328,363

(22) PCT Filed: Jul. 31, 2017

(86) PCT No.: PCT/JP2017/027609
§ 371 (c)(1),
(2) Date: Feb. 26, 2019

(87) PCT Pub. No.: WO2018/055915
PCT Pub. Date: Mar. 29, 2018

(65) Prior Publication Data
US 2021/0286014 A1    Sep. 16, 2021

(30) Foreign Application Priority Data
Sep. 21, 2016  (JP) .............................. JP2016-184735

(51) Int. Cl.
*G01R 31/392* (2019.01)
*G01R 31/3842* (2019.01)
*H01M 10/48* (2006.01)
*H02J 7/00* (2006.01)

(52) U.S. Cl.
CPC ....... *G01R 31/392* (2019.01); *G01R 31/3842* (2019.01); *H01M 10/482* (2013.01); *H02J 7/0047* (2013.01)

(58) Field of Classification Search
CPC .. G01R 31/392; G01R 31/3842; G01R 31/00; G01R 31/003; G01R 31/006;
(Continued)

(56) References Cited

U.S. PATENT DOCUMENTS

2015/0147614 A1    5/2015  Wang et al.
2015/0229150 A1    8/2015  Nakamori et al.

FOREIGN PATENT DOCUMENTS

EP         2 053 414 A2    4/2009
JP        2008-268042 A   11/2008
(Continued)

OTHER PUBLICATIONS

Japanese-language Office Action issued in counterpart Japanese Application No. 2016-184735 dated Jul. 2, 2019 with unverified English translation (eight pages).
(Continued)

*Primary Examiner* — Anthony R Jimenez
(74) *Attorney, Agent, or Firm* — Crowell & Moring LLP

(57) ABSTRACT

The life of a secondary battery has not been able to be prolonged due to deterioration of the secondary battery. In one step, whether a difference between an average value of a negative electrode capacity deviations calculated in a different step and a negative electrode capacity deviation calculated in another step is larger than a predetermined value is determined. In a case where the average value of the measured negative electrode capacity deviations is larger than the ideal negative electrode capacity deviation, and deterioration of the negative electrode capacity deviation is proceeding, a secondary battery is controlled to operate at a high voltage in a further step. With the control, the deterioration of the negative electrode capacity deviation is suppressed and the life of the secondary battery is prolonged.

6 Claims, 5 Drawing Sheets

(58) Field of Classification Search
CPC ........ H02J 7/0047; H02J 7/00; H01M 10/482; H01M 2010/4271; H01M 2010/4278; H01M 2010/4292; H01M 10/00; H01M 10/02; H01M 10/42; H01M 10/44; H01M 10/441; H01M 10/48; H01M 10/484; H01M 10/486; H01M 10/488
USPC .......................................................... 429/90
See application file for complete search history.

(56) References Cited

FOREIGN PATENT DOCUMENTS

| | | |
|---|---|---|
| JP | 2009-80093 A | 4/2009 |
| JP | 2012-135168 A | 7/2012 |
| JP | 2013-92398 A | 5/2013 |
| JP | 2014-63576 A | 4/2014 |
| JP | 2015-26478 A | 2/2015 |
| WO | WO 2014/046179 A1 | 3/2014 |
| WO | WO 2015/011534 A2 | 1/2015 |
| WO | WO 2015/019427 A1 | 2/2015 |

OTHER PUBLICATIONS

International Search Report (PCT/ISA/210) issued in PCT Application No. PCT/JP2017/027609 dated Oct. 3, 2017 with English translation (five (5) pages).

Japanese-language Written Opinion (PCT/ISA/237) issued in PCT Application No. PCT/JP2017/027609 dated Oct. 3, 2017 (five (5) pages).

Extended European Search Report issued in European Application No. 17852696.8 dated Feb. 12, 2020 (seven (7) pages).

SECONDARY BATTERY CONTROL DEVICE

TECHNICAL FIELD

The present invention relates to a secondary battery control device.

BACKGROUND ART

In recent years, there have been demands for technological development in life prolongation and prediction of life of secondary batteries. This is because, in electric vehicles and the like using a secondary battery as a power source of a vehicle traveling motor, it is necessary to accurately grasp a deterioration state of the secondary battery and replace the secondary battery before failure due to the deterioration of the secondary battery occurs.

As a technology for predicting the life of a secondary battery, PTL 1 describes a technology for knowing states of a charge and discharge curve of a whole positive electrode and a charge and discharge curve of a whole negative electrode inside the secondary battery in a nondestructive manner. According to this technology, a discharge capacity of a battery is determined according to member factors such as an effective positive electrode active material amount, an effective negative electrode active material amount, and a positional relationship between a positive electrode and a negative electrode, and these values are expressed by functions with variables such as a use period, a temperature, and a voltage. Deterioration states of the member factors of the secondary battery are estimated on the basis of the functions.

CITATION LIST

Patent Literature

PTL 1: JP 2009-80093 A

SUMMARY OF INVENTION

Technical Problem

In the above-described device in PTL 1, the life of the secondary battery cannot be prolonged according to the deterioration of the secondary battery.

Solution to Problem

A secondary battery control device according to the present invention includes a degree of deterioration calculation unit configured to calculate the degree of deterioration of a secondary battery for each member factor of the secondary battery, a determination unit configured to determine a deteriorated member factor, of the member factors of the secondary battery on the basis of a calculation result of the degree of deterioration calculation unit, and a control unit configured to change an operation condition of the secondary battery according to the deteriorated member factor.

Advantageous Effects of Invention

According to the present invention, the life of the secondary battery can be prolonged by performing control according to the deterioration of the secondary battery.

DESCRIPTION OF EMBODIMENTS

Embodiments of the present invention will be described with reference to the drawings. Note that, as described in PTL 1, the charge and discharge curve of the secondary battery obtained in a case where charge and discharge of the secondary battery is performed with a minute current is favorably reproduced by performing superposition calculation of separately measured charge and discharge curves of the positive electrode alone and the negative electrode alone. Then, as parameters to be used for this calculation, the positive electrode active material amount contributing to the charge and discharge, the negative electrode active material amount contributing to the charge and discharge, and an index of the positional relationship between the charge and discharge curves of the positive electrode and the negative electrode are determined. In the present embodiment, a use rate of the positive electrode active material amount is described as a positive electrode use rate, a use rate of the negative electrode active material amount is described as a negative electrode use rate, and the index of the positional relationship between the charge and discharge curves of the positive electrode and the negative electrode is described as a negative electrode capacity deviation.

Figure 1:
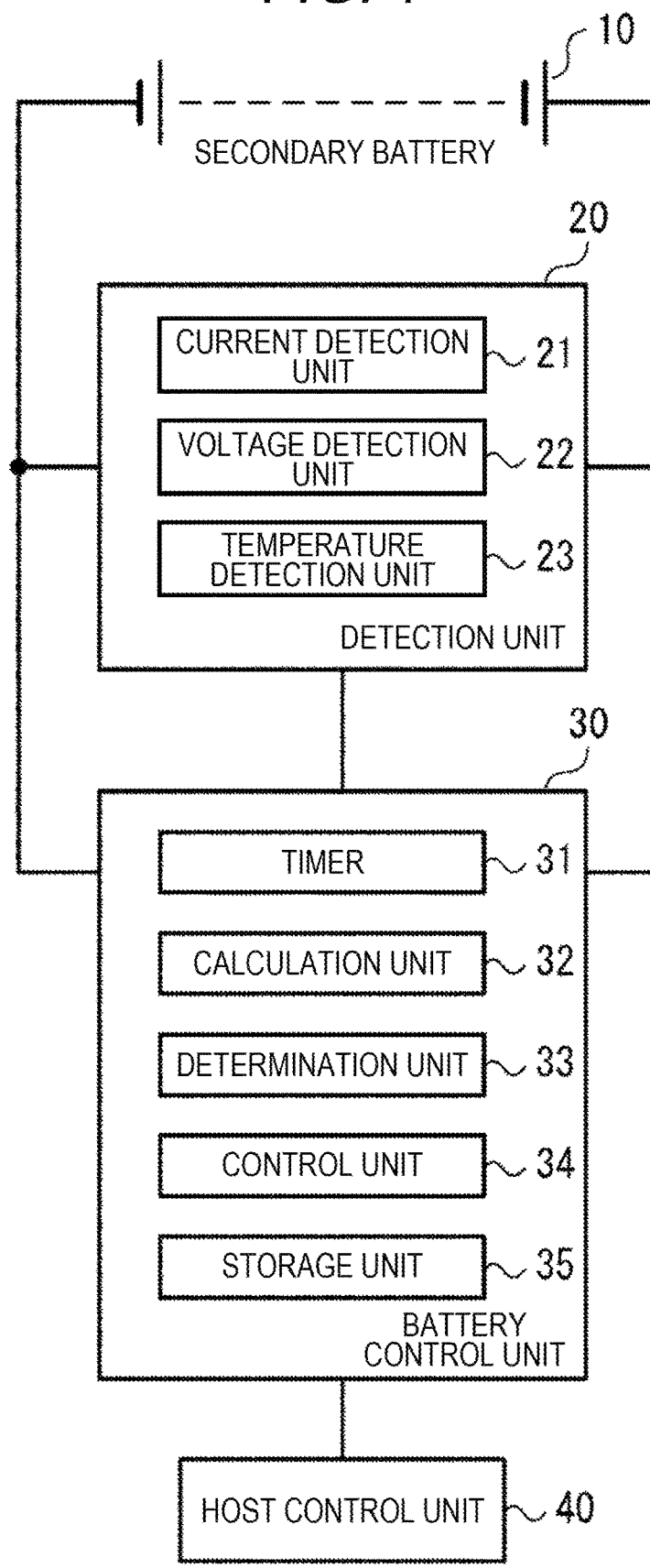
FIG. 1 is a diagram illustrating a secondary battery system.

FIG. 1 is a diagram illustrating a secondary battery system. The secondary battery system includes a secondary battery 10, a detection unit 20, a battery control unit 30, and a host control unit 40. The secondary battery 10 is configured by connecting a plurality of cells in series. Note that although FIG. 1 illustrates an example in which a plurality of cells is connected in series, cells connected in series may be further provided in parallel. The secondary battery 10 is used, for example, as a power source of a vehicle traveling motor.

The detection unit 20 includes a current detection unit 21 that detects a current flowing through the secondary battery 10, a voltage detection unit 22 that detects a voltage of the secondary battery 10, a temperature detection unit 23 that detects a temperature of the secondary battery 10.

The battery control unit 30 includes a timer 31, a calculation unit 32, a determination unit 33, a control unit 34, and a storage unit 35. The current detected by the current detection unit 21, the voltage detected by the voltage detection unit 22, and the temperature detected by the temperature detection unit 23 are input to the battery control unit 30. Further, the battery control unit 30 controls a charge and discharge state of the secondary battery 10 according to a predetermined operation condition.

In the timer 31, a time interval for detecting the current, voltage, and temperature of the secondary battery 10 is set. The calculation unit 32 calculates the degree of deterioration for each member factor of the secondary battery 10, for example, the positive electrode use rate, the negative electrode use rate, and the negative electrode capacity deviation on the basis of first prediction expressions to be described below. The determination unit 33 determines a deteriorated member factor of the secondary battery 10 on the basis of a calculation result by the calculation unit 32.

The control unit 34 changes the operation condition of the secondary battery 10 according to the deteriorated member factor. As the change of the operating condition, for example, the secondary battery 10 is operated at a high voltage, or an upper limit current of the secondary battery is lowered and the secondary battery 10 is operated. The control unit 34 controls the charge and discharge state of the secondary battery 10 according to the operating condition.

The storage unit 35 stores a function of a use time and an ideal degree of deterioration of the secondary battery 10 as a second prediction expression in advance. This second prediction expression indicates transition of an ideal degree of deterioration of the secondary battery 10, and is a predefined function in accordance with a use form of the secondary battery. Note that the relationship between the use time and the degree of deterioration of the secondary battery 10 is not limited to the function and may be stored as a table in advance. The host control unit 40 is connected to the battery control unit 30 and instructs the battery control unit 30 to issue commands of charge and discharge and the like.

Figure 2A:
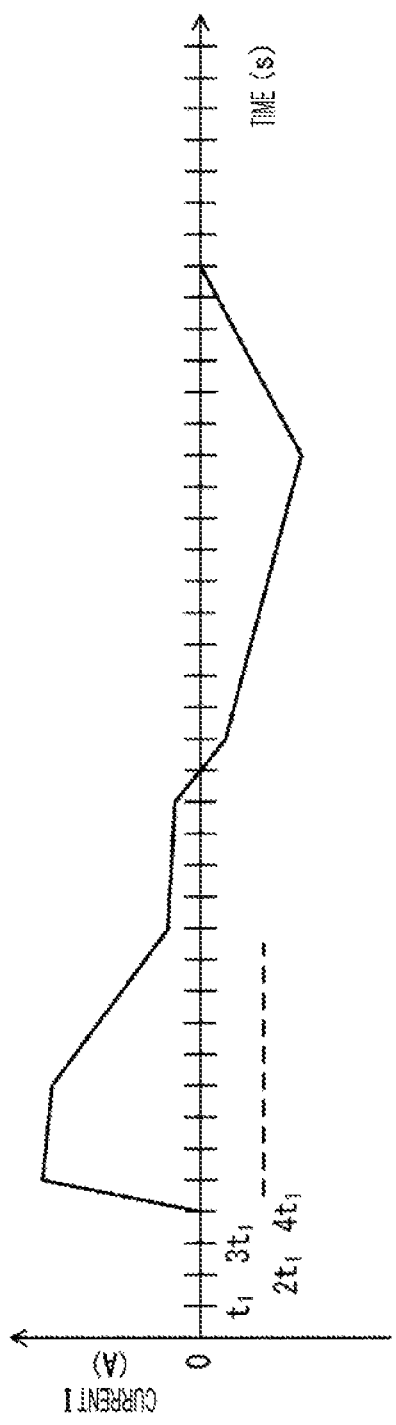
FIG. 2A is a graph illustrating a measurement example of a current of a secondary battery.
Figure 2B:
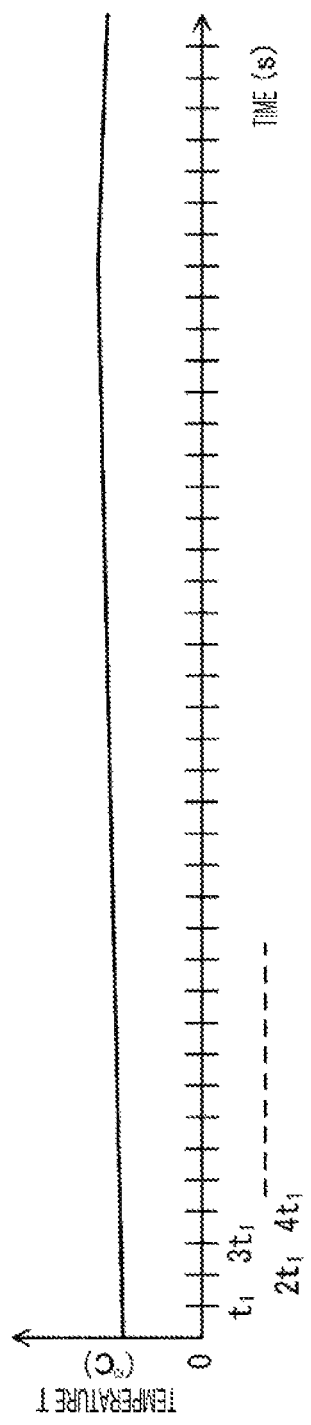
FIG. 2B is a graph illustrating a measurement example of a temperature of the secondary battery.
Figure 2C:
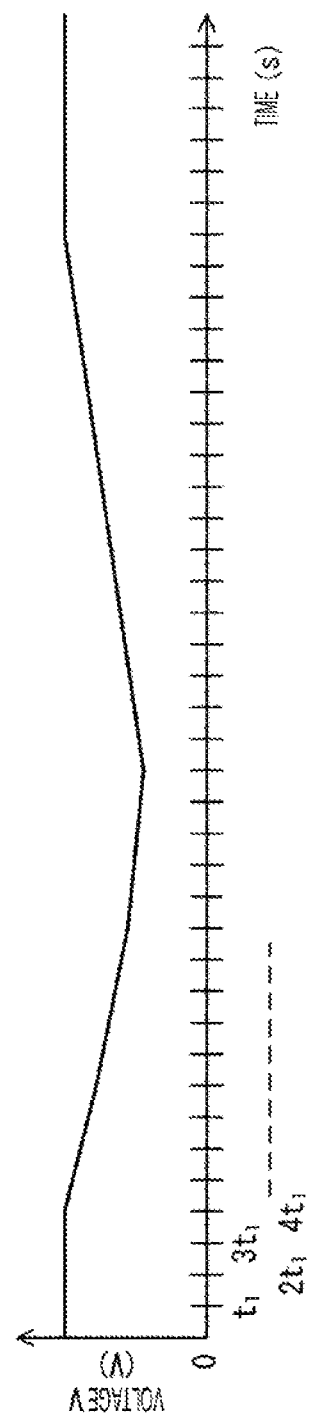
FIG. 2C is a graph illustrating a measurement example of a voltage of the secondary battery.

FIG. 2 is a graph illustrating measurement examples of the secondary battery 10 by the detection unit 20. FIG. 2(*a*) illustrates the current, FIG. 2(*b*) illustrates the temperature, and FIG. 2(*c*) illustrates the voltage. The horizontal axis of each graph represents time, and values measured at time $t_1$ intervals are plotted into the graphs.

As illustrated in FIG. 2(*a*), a current I flowing through the secondary battery 10 is initially 0, then rapidly flows in a plus direction, and then gradually decreases. Thereafter, the current I flows in a minus direction, and gradually approaches 0.

As illustrated in FIG. 2(*b*), the temperature T of the secondary battery 10 slightly rises over time. As illustrated in FIG. 2(*c*), a voltage V of the secondary battery 10 is initially high, and then transitions to be low and high again. Note that the graphs illustrated in FIGS. 2(*a*), 2(*b*) and 2(*c*) are examples for describing the present embodiment, and other measured values may be used. These measured values are detected by the current detection unit 21, the voltage detection unit 22, and the temperature detection unit 23 at every time $t_1$ defined by the timer 31 of the battery control unit 30, and the values are sent to the battery control unit 30.

The calculation unit 32 of the battery control unit 30 calculates a positive electrode use rate mp1, a negative electrode use rate mn1, and a negative electrode capacity deviation dn1 by the following first prediction expressions (1) to (3).

$$mp1 = f1(I,V,T,t) \tag{1}$$

$$mn1 = g1(I,V,T,t) \tag{2}$$

$$dn1 = h1(I,V,T,t) \tag{3}$$

Here, f1, g1, and h1 are functions with the current I, the voltage V, the temperature T, and the time t as variables. The current I, the voltage V, and the temperature T are values detected by the current detection unit 21, the voltage detection unit 22, and the temperature detection unit 23, respectively. From these first prediction expressions (1) to (3), the positive electrode use rate mp1, the negative electrode use rate mn1, and the negative electrode capacity deviation dn1 at every time $t_1$ are obtained.

Figure 3:
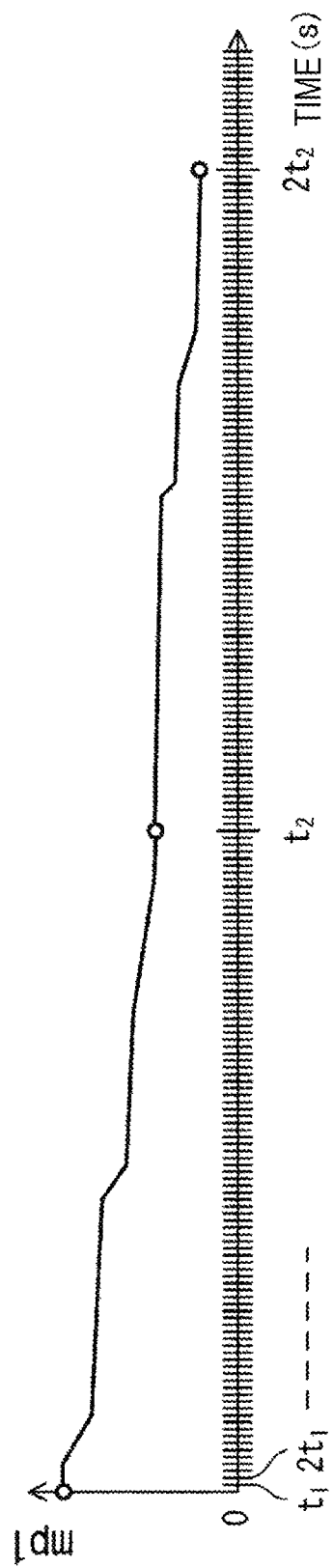
FIG. 3 is a graph illustrating an example of transition of a positive electrode use rate mp1.

FIG. 3 is a graph illustrating an example of transition of the positive electrode use rate mp1 calculated at every time $t_1$. In FIG. 3, the horizontal axis represents time, and a time $t_2$ is a time interval longer than the time $t_1$. This example illustrates the positive electrode use rate mp1 gradually lowers (is deteriorated). Although graphs illustrating transition of the negative electrode use rate mn1 and the negative electrode capacity deviation dn1 are omitted, the negative electrode use rate mn1 gradually lowers (is deteriorated) over time, and the negative electrode capacity deviation dn1 gradually rises (is deteriorated).

Figure 4:
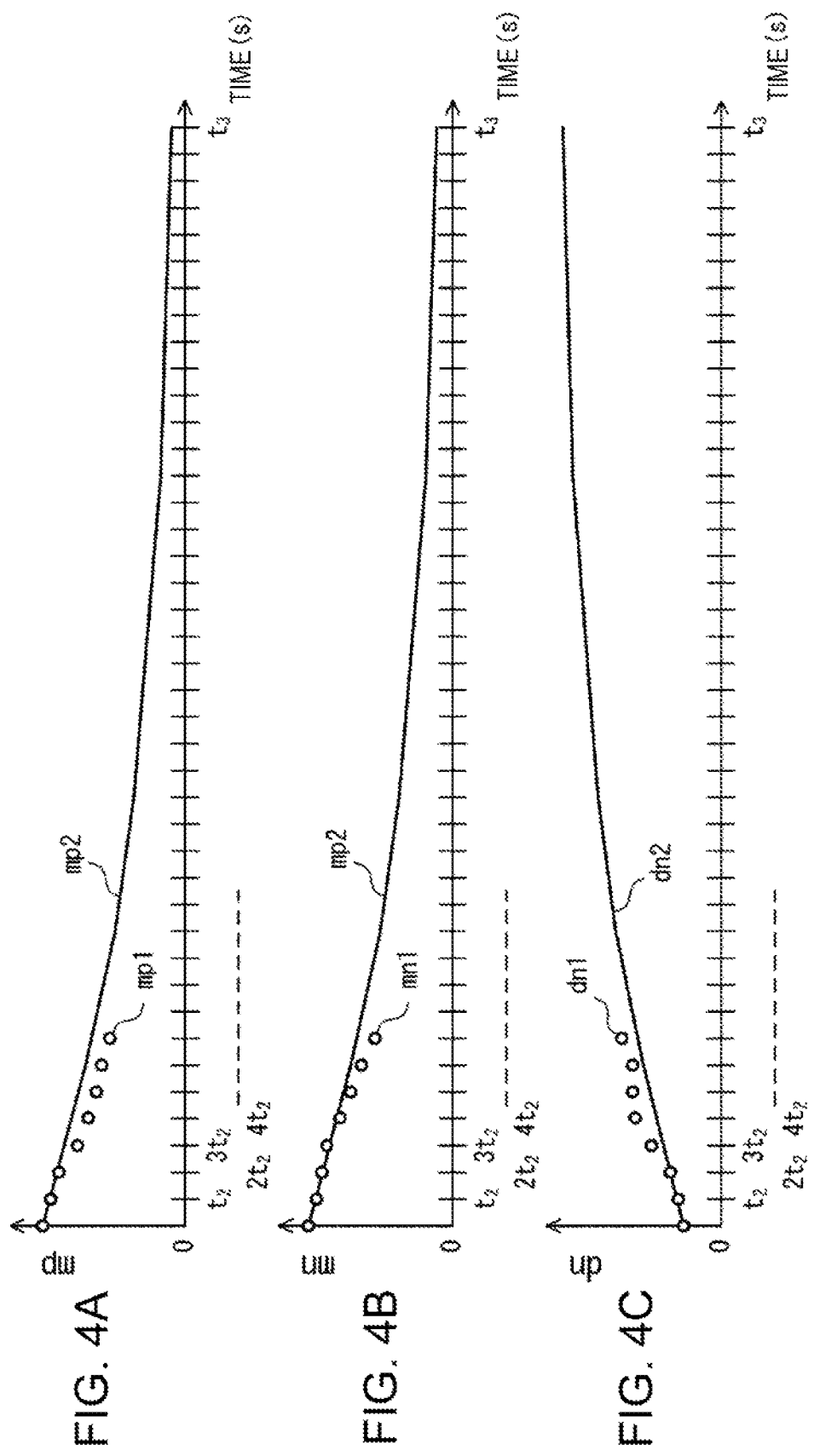
FIG. 4A is a graph illustrating a positive electrode use rate mp.
FIG. 4B is a graph illustrating a negative electrode use rate mn.
FIG. 4C is a graph illustrating a negative electrode capacity deviation dn.

FIG. 4(*a*) is a graph illustrating an example of transition of the positive electrode use rate mp at every time $t_2$, FIG. 4(*b*) is a graph illustrating an example of transition of the negative electrode use rate mn, and FIG. 4(*c*) is a graph illustrating an example of transition of the negative electrode capacity deviation. The circles in the figures illustrate degrees of deterioration at the time $t_2$ intervals based on measured values calculated by the first prediction expressions, that is, the positive electrode use rate mp1, the negative electrode use rate mn1, and the negative electrode capacity deviation dn1, respectively. The solid lines in the figures illustrate transition of ideal degrees of deterioration based on the second prediction expressions. The ideal degrees of deterioration are defined by the following second prediction expressions (4) to (6).

$$mp2 = f2(t) \tag{4}$$

$$mn2 = g2(t) \tag{5}$$

$$dn2 = h2(t) \tag{6}$$

Here, f2, g2, and h2 are functions with the time t as a variable. From these second prediction expressions (4) to (6), a positive electrode use rate mp2, a negative electrode use rate mn2, and a negative electrode capacity deviation dn2 indicating the ideal degrees of deterioration at every time $t_2$ are obtained. The second prediction expressions (4) to (6) express, for example, ideal deterioration transitions that become desired degrees of deterioration at a time $t_3$. Note that the time $t_2$ < the time $t_3$.

Describing with reference to FIG. 4(*a*), the degree of deterioration of the positive electrode use rate mp1 based on the measured value calculated by the first prediction expression is larger than the ideal degree of deterioration of the positive electrode use rate mp2 based on the second prediction expression. Further, as illustrated in FIG. 4(*b*), the deterioration degree of the negative electrode use rate mn1 based on the measured value calculated by the first prediction expression is larger than the ideal degree of deterioration of the negative electrode use rate mn2 based on the second prediction expression. Further, as illustrated in FIG. 4(*c*), the degree of deterioration of the negative electrode capacity deviation dn1 based on the measured value calculated by the first prediction expression is larger than the ideal degree of deterioration of the negative electrode capacity deviation dn2 based on the second prediction expression. In the present embodiment, as will be described below, in a case where the degree of deterioration based on the measured value calculated by the first prediction expression is separated from the ideal degree of deterioration based on the second prediction expression, the operating condition of the secondary battery 10 is changed according to the deteriorated member factor, for example, the positive electrode use rate, the negative electrode use rate, or the negative electrode capacity deviation.

Figure 5:
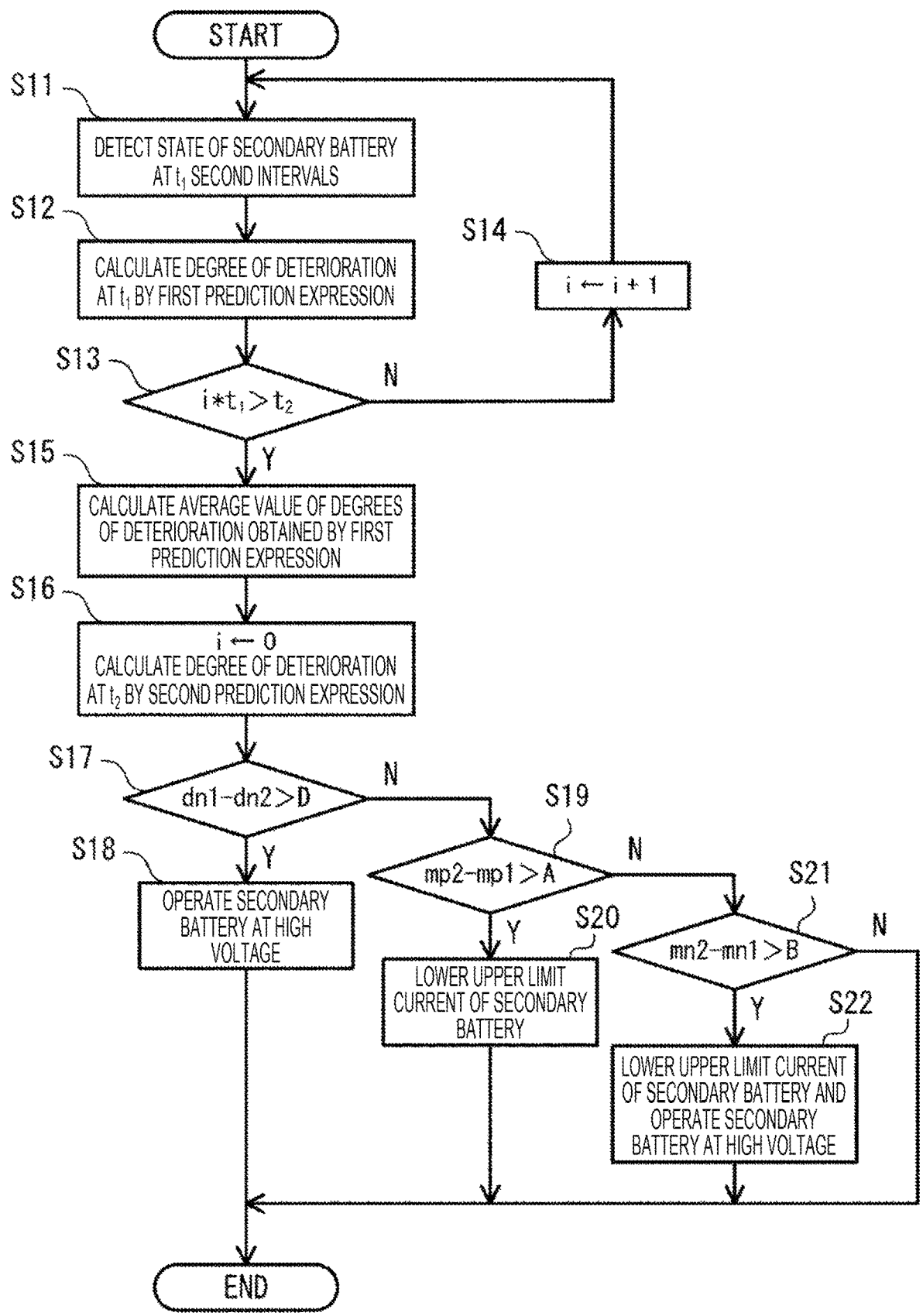
FIG. 5 is a flowchart illustrating a processing operation of a battery control unit.

Next, an operation of the present embodiment will be described with reference to the flowchart of FIG. 5. The flowchart of FIG. 5 illustrates a processing operation periodically executed by the battery control unit 30. Note that a part of the processing operation illustrated in this flowchart may be performed by the host control unit 40.

In step S11 in FIG. 5, the state of the secondary battery 10 is detected at the time $t_1$ second intervals. Specifically, when $t_1$ seconds have elapsed from previous detection by the timer 31, the current detection unit 21 detects the current, the voltage detection unit 22 detects the voltage, and the temperature detection unit 23 detects the temperature.

In step S12, the degrees of deterioration at the time $t_1$ are calculated by the first prediction expressions (1) to (3). Specifically, the positive electrode use rate mp1, the negative electrode use rate mn1, and the negative electrode capacity deviation dn1 are calculated by the first prediction expressions (1) to (3) on the basis of the current, the voltage, and the temperature detected in step S11. In step S12, the degrees of deterioration calculated at the time $t_1$ second intervals are stored in the storage unit 35.

In step S13, whether $i \times t_1$ is larger than $t_2$ is determined. i is a positive integer. That is, whether the calculation at the time $t_1$ intervals is performed i times and the time $t_2$ has passed is determined. When the time $t_2$ has not elapsed, i is incremented by 1 in step S14, and the processing returns to step S11. When the time $t_2$ has elapsed, the processing proceeds to step S15.

In step S15, an average value of the degrees of deterioration calculated at the time $t_1$ second intervals up to the time $t_2$ and stored in the storage unit 35. That is, average values of the positive electrode use rates mp1, the negative electrode use rates mn1, and the negative electrode capacity deviations dn1 are calculated.

In step S16, i is updated to zero. Then, the degrees of deterioration at the time $t_2$ is calculated by the second prediction expressions (4) to (6). Specifically, the positive electrode use rate mp2, negative electrode use rate mn2, and negative electrode capacity deviation dn2 at the time $t_2$ are calculated on the basis of the second prediction expressions (4) to (6). The calculated degrees of deterioration are stored in the storage unit 35.

In step S17, the determination unit 33 determines whether a difference between the average value of the negative electrode capacity deviations dn1 calculated in step S15 and the negative electrode capacity deviation dn2 calculated in step S16 is larger than a predetermined value D. The example illustrated in FIG. 4(c) is a case where the degree of deterioration of the negative electrode capacity deviation dn1 is large. As described above, in the case where the average value of the measured negative electrode capacity deviations dn1 is larger than the ideal negative electrode capacity deviation dn2, and the deterioration of the negative electrode capacity deviation dn1 is proceeding, the mainly deteriorated member factor in the secondary battery 10 is determined to be the negative electrode capacity deviation, and the processing proceeds to next step S18.

In step S18, the control unit 34 controls the secondary battery 10 to operate at a high voltage. With the control, the deterioration of the negative electrode capacity deviation dn1 is suppressed and the life of the secondary battery 10 is prolonged. In a case where the difference between the average value of the negative electrode capacity deviations dn1 and the negative electrode capacity deviation dn2 is determined not to be larger than the value D in step S17, the processing proceeds to step S19.

In step S19, the determination unit 33 determines whether the positive electrode use rate mp2 calculated in step S16 and the average value of the positive electrode use rates mp1 calculated in step S15 is larger than a predetermined value A. The example illustrated in FIG. 4(a) is a case where the degree of deterioration of the positive electrode use rate mp1 is large. As described above, in the case where the average value of the measured positive electrode use rates mp1 is lower than the ideal positive electrode use rate mp2, and the deterioration of the positive electrode use rate mp1 is proceeding, the mainly deteriorated member factor in the secondary battery 10 is determined to be the positive electrode use rate, and the processing proceeds to next step S20.

In step S20, the control unit 34 lowers the upper limit current of the secondary battery 10 and controls the secondary battery 10 to operate. With the control, the deterioration of the positive electrode use rate mp1 is suppressed, and the life of the secondary battery 10 is prolonged. In a case where the difference between the positive electrode use rate mp2 and the average value of the positive electrode use rates mp1 is determined not to be larger than the value A in step S19, the processing proceeds to step S21.

In step S21, the determination unit 33 determines whether a difference between the negative electrode use rate mn2 calculated in step S16 and the average value of the negative electrode use rates mn1 calculated in step S15 is larger than a predetermined value B. The example illustrated in FIG. 4(b) is a case where the degree of deterioration of the negative electrode use rate mn1 is large. As described above, in the case where the average value of the measured negative electrode use rates mn1 is lower than the ideal negative electrode use rate mn2, and the deterioration of the negative electrode use rate mn1 is proceeding, the mainly deteriorated member factor in the secondary battery 10 is determined to be the negative electrode use rate, and the processing proceeds to next step S22.

In step S22, the control unit 34 lowers the upper limit current of the secondary battery 10 and controls the secondary battery 10 to operate. Further, the control unit 34 controls the secondary battery 10 to operate at a high voltage. With the control, the deterioration of the negative electrode use rate mn1 is suppressed and the life of the secondary battery 10 is prolonged. In step S21, in a case where the difference between the negative electrode use rate mn2 and the average value of the negative electrode use rates mn1 is determined not to be larger than the value B, and the processing in steps S18, S20, and S22 is terminated, the flowchart illustrated in FIG. 5 is terminated.

Note that, in step S15, the average values of the positive electrode use rate mp1, the negative electrode use rate mn1, and the negative electrode capacity deviation dn1 have been calculated, and in steps S17, S19, and S21, these average values and the positive electrode use rate mp2, the negative electrode use rate mn2, and the negative electrode capacity deviation dn2 have been compared. However, the degrees of deteriorations at the time $t_2$ may be calculated by the first prediction expressions (1) to (3) and the calculated values, instead of calculating the average values, and the positive electrode use rate mp2, the negative electrode use rate mn2, and the negative electrode capacity deviation dn2 may be compared.

According to the above-described embodiment, the following functions and effects can be obtained. (1) The battery control unit 30 includes the calculation unit 32 that calculates the degree of deterioration of the secondary battery 10 for each of the member factors of the secondary battery 10, for example, the positive electrode use rate, the negative electrode use rate, and the negative electrode capacity deviation, the determination unit 33 that determines the deteriorated member factor, of the member factors of the secondary battery 10, on the basis of the calculation result of the calculation unit 32, and the control unit 34 that changes the operating condition of the secondary battery 10 according to the deteriorated member factor. With the configuration, the life of the secondary battery 10 can be prolonged by performing control according to the deterioration of the secondary battery 10.

(Modification)

The present invention can be implemented by modifying the above-described embodiment as follows. (1) The positive electrode use rate, the negative electrode use rate, and the negative electrode capacity deviation have been exemplarily described as the member factors of the secondary battery. However, the embodiment is not limited to the example, and a deviation amount of a positive electrode voltage, a coefficient that is a parameter related to positive electrode resistance of the secondary battery, a coefficient that is a parameter related to a negative electrode resistance of the secondary battery, or a coefficient related to another resistance component may be employed as the member factor of the secondary battery.

(2) The examples in which the secondary battery is operated at a high voltage, and the upper limit current of the secondary battery is lowered and the secondary battery is operated have been described as the operating conditions of the secondary battery. However, the embodiment is not limited to the example, and a starting voltage, an ending voltage, a maximum voltage, a minimum voltage, an ambient temperature, a charge capacity, a discharge capacity, electric quantity fluctuation per unit time, a maximum current, an average current, a lower limit current, an operation center voltage, a residence time ratio in each voltage domain, an energization polarity ratio per unit time, an energization time ratio, a pause time ratio, upper and lower limit voltages, an SOC fluctuation width, an energization time, and the like may be used as the operating condition.

The present invention is not limited to the above-described embodiments, and other forms conceivable within the technical idea of the present invention are also included in the scope of the present invention unless the characteristics of the present invention are impaired. Further, a configuration of a combination of the above-described embodiment and a plurality of modifications may be adopted.

REFERENCE SIGNS LIST

10 secondary battery
20 detection unit
21 current detection unit
22 voltage detection unit
23 temperature detection unit
30 battery control unit
31 timer
32 calculation unit
33 determination unit
34 control unit
35 storage unit
40 host control unit

The invention claimed is:

1. A secondary battery control device comprising:
a degree of deterioration calculation unit configured to calculate a degree of deterioration of a secondary battery for each member factor of the secondary battery;
a determination unit configured to determine a deteriorated member factor, of the member factors of the secondary battery, on the basis of a calculation result of the degree of deterioration calculation unit; and
a control unit configured to change an operation condition of the secondary battery according to the deteriorated member factor, wherein
the deteriorated member factor is at least one of:
a positive electrode use rate, a negative electrode use rate, or a negative electrode capacity deviation;
the positive electrode use rate is a use rate of the positive electrode active material amount;
the negative electrode use rate is a use rate of the negative electrode active material amount; and
the control unit is further configured to:
lower an upper limit current value that is the operation condition of the secondary battery; and
operate the secondary battery in a case where the deteriorated member factor is the positive electrode use rate.

2. The secondary battery control device according to claim 1 wherein
the control unit is configured to operate the secondary battery at an increased voltage as the operation condition of the secondary battery in a case where the deteriorated member factor is the negative electrode capacity deviation.

3. The secondary battery control device according claim 1, wherein
the control unit is configured to:
lower the upper limit current value of the secondary battery and operate the secondary battery, and
operate the secondary battery at an increased voltage as the operation conditions of the secondary battery in a case where the deteriorated member factor is the negative electrode use rate.

4. The secondary battery control device according to claim 1, wherein
the degree of deterioration calculation unit is configured to calculate a difference between a current degree of deterioration and a predefined degree of deterioration for each member factor of the secondary battery, and
the determination unit is configured to determine a member factor having a difference between the current degree of deterioration and the predefined degree of deterioration exceeding a predetermined value as the deteriorated member factor.

5. The secondary battery control device according to claim 4, wherein
the degree of deterioration calculation unit is configured to calculate the current degree of deterioration on the basis of a use time of the secondary battery, a current value, a voltage value, and a temperature of the secondary battery.

6. The secondary battery control device according claim 4, wherein
the degree of deterioration calculation unit is configured to define the predefined degree of deterioration as a function of the use time and the degree of deterioration of the secondary battery.

* * * * *